US011800633B2

(12) United States Patent
Liang et al.

(10) Patent No.: US 11,800,633 B2
(45) Date of Patent: Oct. 24, 2023

(54) INDUCTOR AND POWER MODULE

(71) Applicant: CHILISIN ELECTRONICS CORP., Hsinchu County (TW)

(72) Inventors: Hung-Chih Liang, Taoyuan (TW); Pin-Yu Chen, Taoyuan (TW); Hsiu-Fa Yeh, Taoyuan (TW); Hang-Chun Lu, Taoyuan (TW); Ya-Wan Yang, Taoyuan (TW); Yu-Ting Hsu, Taoyuan (TW)

(73) Assignee: CHILISIN ELECTRONICS CORP., Hsinchu County (TW)

(\*) Notice: Subject to any disclaimer, the term of this patent is extended or adjusted under 35 U.S.C. 154(b) by 212 days.

(21) Appl. No.: 17/523,018

(22) Filed: Nov. 10, 2021

(65) Prior Publication Data
US 2022/0183142 A1 Jun. 9, 2022

(30) Foreign Application Priority Data

Dec. 9, 2020 (TW) .................................. 109143397
Sep. 8, 2021 (TW) .................................. 110133303

(51) Int. Cl.
*H05K 1/02* (2006.01)
(52) U.S. Cl.
CPC ...................... *H05K 1/0209* (2013.01); *H05K 2201/1003* (2013.01); *H05K 2201/10416* (2013.01)
(58) Field of Classification Search
CPC ...... H05K 1/0209; H05K 1/0203; H05K 1/02; H05K 1/181; H05K 1/182; H05K 1/18;
(Continued)

(56) References Cited

U.S. PATENT DOCUMENTS

2006/0089022 A1\* 4/2006 Sano ....................... H01F 17/06
439/79
2008/0001279 A1\* 1/2008 Elbanhawy ............. H01L 25/16
257/691
(Continued)

FOREIGN PATENT DOCUMENTS

CN 212750529 U \* 3/2021
TW 200539198 A 12/2005
(Continued)

OTHER PUBLICATIONS

WO-2019218344 English Translation (Year: 2019).\*
CN-212750529 English Translation (Year: 2021).\*

*Primary Examiner* — Amir A Jalali
(74) *Attorney, Agent, or Firm* — Li & Cai Intellectual Property (USA) Office

(57) ABSTRACT

An inductor and a power module are respectively provided. The inductor includes an insulating body and a conductive body. The insulating body has a top surface and a bottom surface. The conductive body includes two pin parts and a heat dissipation part. A portion of each of the pin parts is exposed outside the bottom surface. The portions of the two pin parts exposed outside the insulating body are configured to fix to a circuit board. The heat dissipation part is connected to the two pin parts, the heat dissipation part is exposed outside the top surface, and the heat dissipation part is configured to connect to an external heat dissipation member. When the inductor is fixed to the circuit board through the two pin parts exposed outside the bottom surface, the two pin parts and the bottom surface jointly define an accommodating space for accommodating a chip.

11 Claims, 18 Drawing Sheets

(58) Field of Classification Search
CPC .............. H05K 7/02; H05K 7/10; H05K 7/20; H05K 7/2039; H05K 7/20454; H05K 7/20963; H05K 3/3447; H05K 2201/1003; H05K 2201/10416; H05K 2201/10515; H05K 2201/10901; H05K 2201/083; H05K 2201/10325; H05K 2201/10189; H01F 27/02; H01F 27/025; H01F 27/045; H01F 27/06; H01F 27/08; H01F 27/22; H01F 27/24; H01F 27/26; H01F 27/263; H01F 27/266; H01F 27/28; H01F 27/2823; H01F 27/29; H01F 27/30; H01F 27/306; H01F 27/324; H01F 2027/065; H01L 23/3121; H01L 23/36; H01L 23/49575; H01L 23/5386; H01L 23/645

See application file for complete search history.

(56) References Cited

U.S. PATENT DOCUMENTS

| | | | |
|---|---|---|---|
| 2014/0092575 A1* | 4/2014 | Lee | H01F 5/04 336/65 |
| 2018/0301276 A1* | 10/2018 | Yeh | H01F 27/292 |
| 2019/0131050 A1* | 5/2019 | Danesh Pajooh Nejad | H01F 17/0033 |
| 2019/0172629 A1* | 6/2019 | Zhou | H01F 27/29 |
| 2019/0378643 A1* | 12/2019 | Zhou | H01F 27/2823 |
| 2020/0373217 A1* | 11/2020 | Zhang | H01L 23/645 |
| 2022/0295639 A1* | 9/2022 | Huang | H05K 1/145 |

FOREIGN PATENT DOCUMENTS

| | | | | |
|---|---|---|---|---|
| TW | M522456 U | 5/2016 | | |
| WO | WO-2019218344 A1 * | 11/2019 | ......... | H01L 23/3675 |

* cited by examiner

INDUCTOR AND POWER MODULE

CROSS-REFERENCE TO RELATED PATENT APPLICATION

This application claims the benefit of priority to Taiwan Patent Application Nos. 109143397, filed on Dec. 9, 2020, and 110133303, filed on Sep. 8, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an inductor and a power module, and more particularly to an inductor suitable for small size and high current and a power module suitable for high current.

BACKGROUND OF THE DISCLOSURE

A conventional inductor in a power module dissipates heat generated during an operation of the inductor through additionally using a heat dissipation shell. The heat dissipation shell is connected to a ground terminal of a circuit board. However, when the above-mentioned design is applied to a small-sized power module, a heat dissipation effect of the heat dissipation shell may be poor since a thermal conductivity between the inductor and the heat dissipation shell is not well.

SUMMARY OF THE DISCLOSURE

In response to the above-referenced technical inadequacies, the present disclosure provides an inductor and a power module, which are mainly used to improve the problem of a poor heat dissipation effect of a conventional small-sized and high-current inductor and small-sized power module when heat is dissipated by a heat dissipation shell.

In one aspect, the present disclosure provides an inductor, which includes an insulating body and a conductive body. The insulating body has a top surface and a bottom surface. The conductive body includes two pin parts and a heat dissipation part. A portion of each of the two pin parts is exposed outside the bottom surface, and the two portions of the two pin parts exposed outside the insulating body are respectively configured to fix to a circuit board. The heat dissipation part is connected to the two pin parts, the heat dissipation part is exposed outside the top surface, and the heat dissipation part is configured to connect to an external heat dissipation member. When the inductor is fixed to the circuit board through the two pin parts exposed outside the bottom surface, the two pin parts and the bottom surface jointly define an accommodating space. When the heat dissipation part is connected to the external heat dissipation member, heat energy generated by an operation of the inductor is capable of being transferred to an outside through the heat dissipation part and the external heat dissipation member.

In another aspect, the present disclosure provides a power module, which includes a circuit board, a chip, an external heat dissipation member, and at least one inductor. The chip is fixedly disposed on the circuit board. The inductor includes an insulating body and a conductive body. The insulating body has a top surface and a bottom surface. The conductive body includes two pin parts and a heat dissipation part. A portion of each of the two pin parts is exposed outside the bottom surface, and the two portions of the two pin parts exposed outside the insulating body are respectively fixed to the circuit board. The heat dissipation part is connected to the two pin parts, the heat dissipation part is exposed outside the top surface, and the heat dissipation part is connected to the external heat dissipation member. The inductor is fixed to the circuit board through the two pin parts exposed outside the bottom surface, the two pin parts and the bottom surface jointly define an accommodating space, and the chip is located in the accommodating space. When the heat dissipation part is connected to the external heat dissipation member, a heat energy generated by an operation of the inductor is capable of being transferred to an outside through the heat dissipation part and the external heat dissipation member.

Therefore, the inductor and the power module of the present disclosure can effectively discharge the heat generated by the inductor and the power module during operation through the design of the heat dissipation part of the conductive body.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
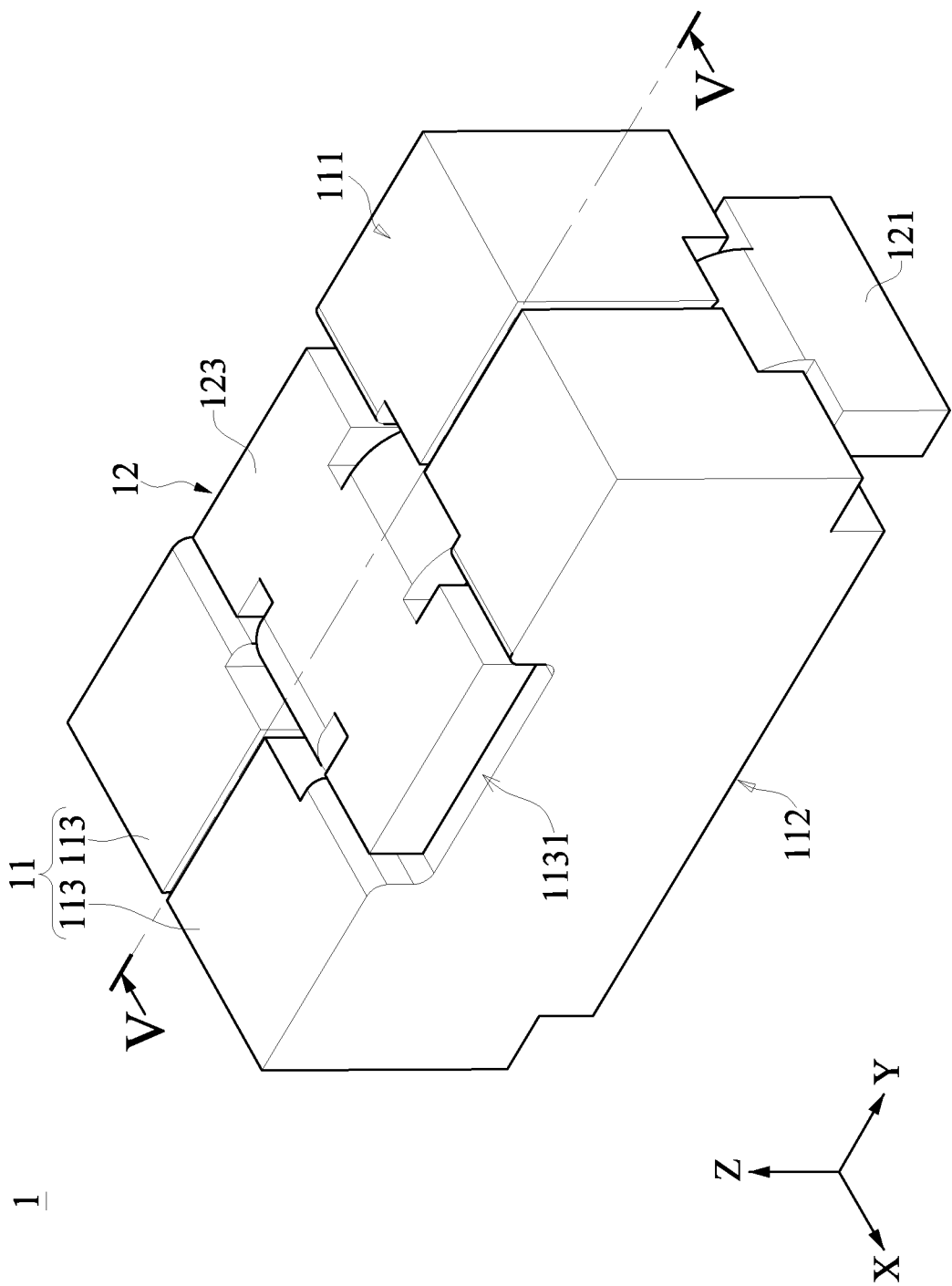
FIG. 1 is a schematic perspective view of an inductor according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
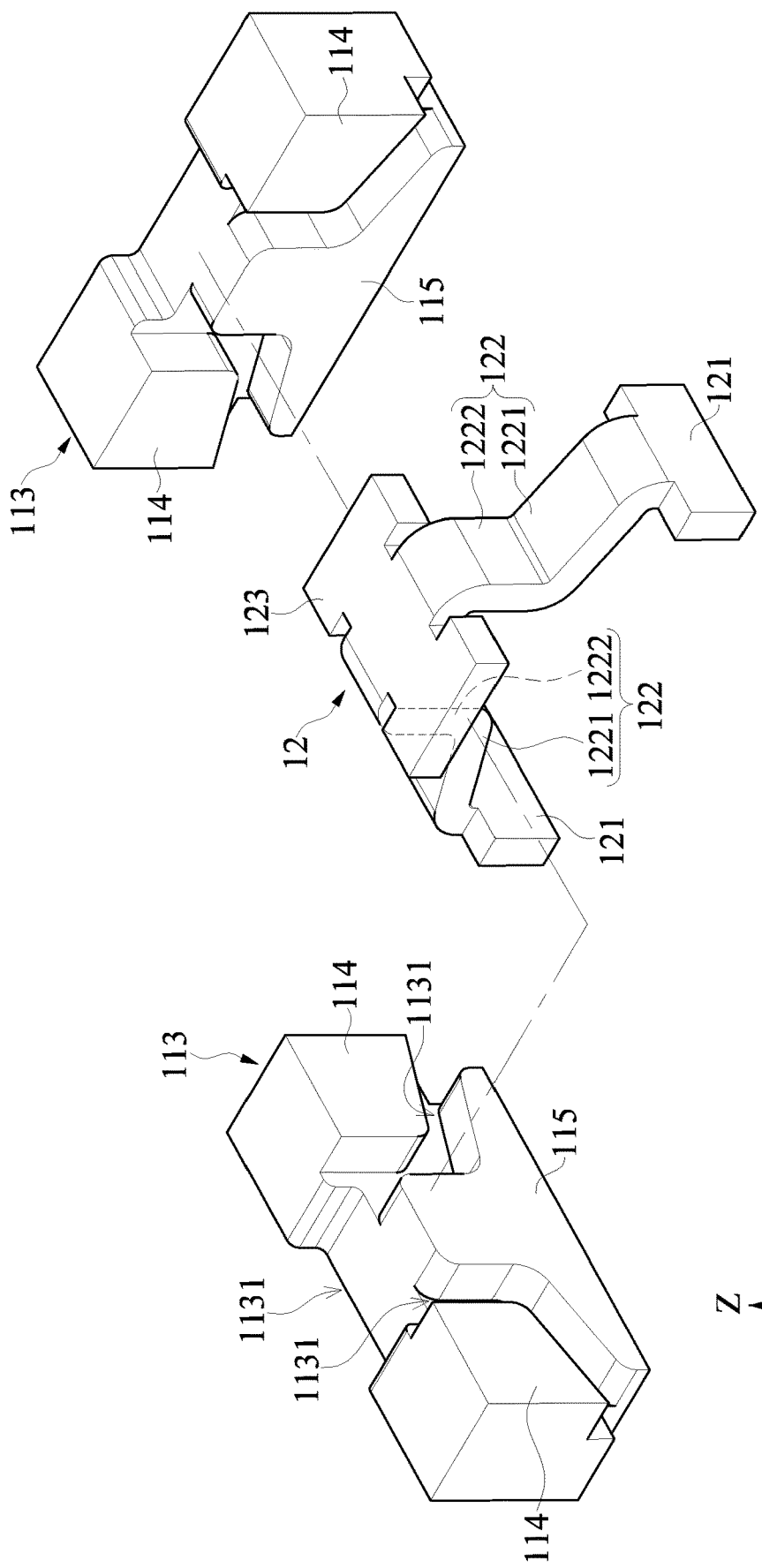
FIG. 2 is a schematic exploded view of the inductor according to the first embodiment of the present disclosure.
Figure 3:
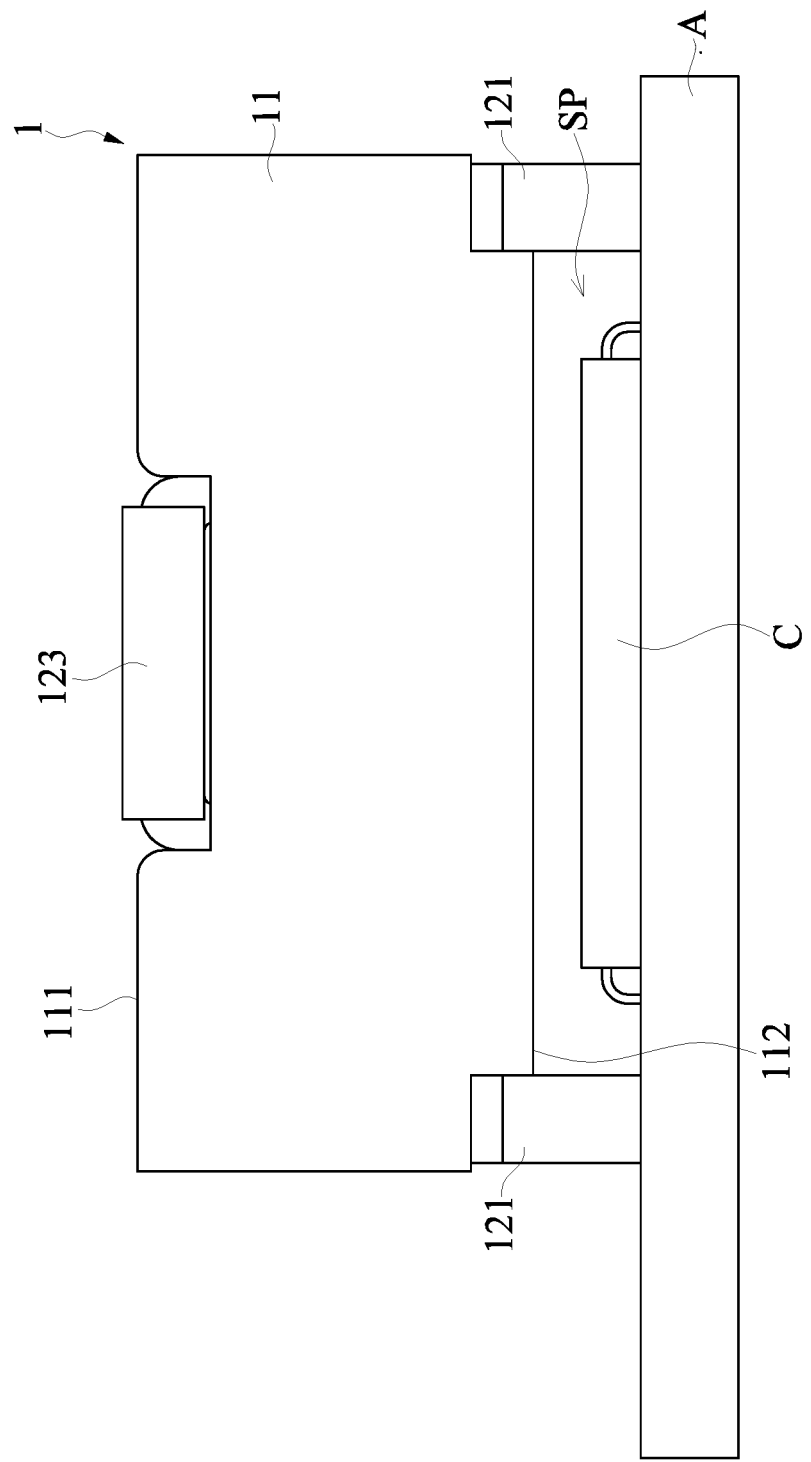
FIG. 3 is a schematic side view of the inductor of the present disclosure being mounted on a circuit board.

Referring to FIG. 1 to FIG. 3, a first embodiment of the present disclosure provides an inductor 1 including an insulating body 11 and a conductive body 12. The insulating body 11 has a top surface 111 and a bottom surface 112, and the top surface 111 and the bottom surface 112 are located on two opposite sides of the insulating body 11. In practical applications, the insulating body 11 may include two combination parts 113. Each of the combination parts 113 can have a groove 1131 corresponding to the shape of the conductive body 12. The grooves 1131 are used to accommodate the conductive body 12. The two combination parts 113 may be fixed to each other by means of adhesion, for example.

The conductive body 12 is fixedly arranged in the insulating body 11. The conductive body 12 includes two pin parts 121, two connecting parts 122, and a heat dissipation part 123. A portion of each of the two pin parts 121 is exposed outside the bottom surface 112. The two portions of the two pin parts 121 exposed outside the insulating body 11 are respectively used to be fixed to a circuit board A. Specifically, the two pin parts 121 exposed outside the insulating body 11 serve as electrodes of the inductor 1. Two ends of each of the connecting parts 122 are respectively connected to one of the two pin parts 121 and the heat dissipation part 123. The two connecting parts 122 are mainly used to connect the heat dissipation part 123 with the two pin parts 121. An appearance of each of the connecting parts 122 is not limited to those shown in the drawings of the present disclosure.

A portion of the heat dissipation part 123 is exposed outside the top surface 111 of the insulating body 11. The heat dissipation part 123 is used for connecting the conductive body 12 with an external heat dissipation member (not shown in the drawings). The external heat dissipation member may be, for example, various types of heat dissipation fins. The external heat dissipation member and the heat dissipation part 123 may be fixed to each other by means of adhesion. A heat dissipation paste may also be disposed between the external heat dissipation member and the heat dissipation part 123.

When the heat dissipation part 123 is connected to the external heat dissipation member, the heat generated when the inductor 1 operates will be able to be transferred to an exterior environment through the heat dissipation part 123 and the external heat dissipation member. In this way, a temperature of the inductor 1 during operation can be effectively reduced, and a service life of the inductor 1 can be prolonged. The appearance and size of the heat dissipation part 123 are not limited to those shown in the drawings. It should be noted that, even in a state where the heat dissipation part 123 is not connected to the external heat dissipation member, the heat generated during the operation of the inductor 1 can still be transferred to the outside through the heat dissipation part 123. The heat dissipation effect of the heat dissipating part 123 is still better than the heat dissipation effect of the conventional heat dissipation shell arranged around the inductor.

As shown in FIG. 3, when the inductor 1 is fixed to the circuit board A through the two pin parts 121 exposed outside the bottom surface 112, the two pin parts 121 and the bottom surface 112 jointly form an accommodating space SP. The accommodating space SP can be used to accommodate the chip C disposed on the circuit board A. Through this design, the circuit board A can be used more effectively.

Figure 4:
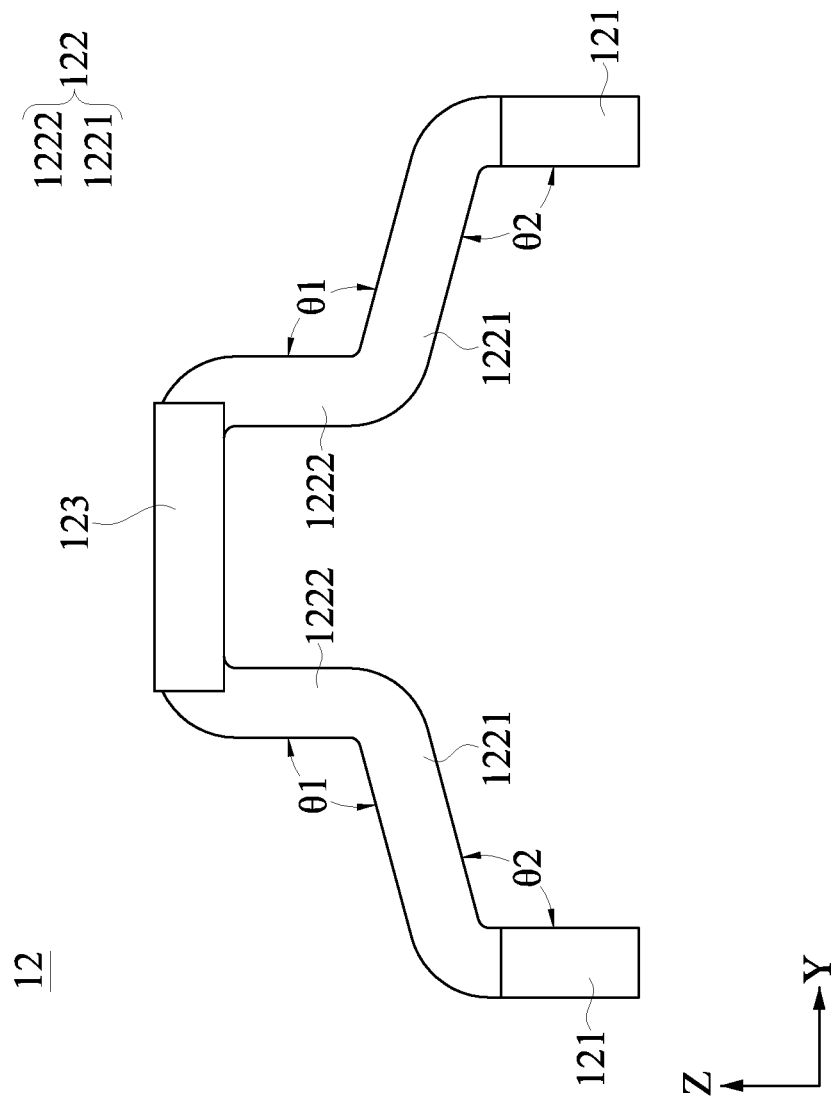
FIG. 4 is a schematic side view of a conductive body of the inductor according to the first embodiment of the present disclosure.

As shown in FIG. 2 to FIG. 5, when the inductor 1 is fixed on the circuit board A, the two pin parts 121 and the bottom surface 112 jointly form the accommodating space SP. In an embodiment where a width W of the inductor 1 is greater than twice a height H of the inductor 1, each of the connecting parts 122 of the conductive body 12 may include an oblique section 1221 and a longitudinal section 1222. Two ends of the oblique section 1221 are respectively connected to one of the two pin parts 121 and one of the two longitudinal sections 1222. Two sides of the heat dissipation part 123 are respectively connected to the two longitudinal sections 1222. In a side view of the conductive body 12 as shown in FIG. 4, an included angle θ1 between each of the longitudinal sections 1222 and the corresponding oblique section 1221 connected thereto is greater than 90 degrees and less than 150 degrees, and an included angle θ2 between each of the oblique sections 1221 and the corresponding pin part 121 connected thereto is greater than 90 degrees and less than 150 degrees. By enabling each of the connecting parts 122 of the conductive body 12 to include an oblique section 1221 and a longitudinal section 1222, and enabling the oblique section 1221, the longitudinal section 1222, and the pin part 121 to conform to the above-mentioned angle design, a relevant personnel can simply modify the appearances of the conductive body 12 and the insulating body 11, and the relevant properties of the inductor 1 (i.e., withstand voltage, inductance, etc.) can easily meet requirements for general usage (i.e., having withstand voltage between 20% and 30%, etc.). This design can also enable the conductive body 12 to be relatively easily bent during a manufacturing process.

In an embodiment where a thickness of the conductive body 12 is greater than 0.5 millimeters (mm) and a width of the inductor 1 is greater than twice a height of the inductor 1, if the included angle between each of the longitudinal sections 1222 and the corresponding oblique section 1221 connected thereto is equal to 90 degrees, or the included angle between each of the oblique sections 1221 and the corresponding pin part 121 connected thereto is equal to 90 degrees, the conductive body 12 will be difficult to be bent, and the relevant properties of the inductor 1 are also difficult to meet general requirements.

Figure 5:
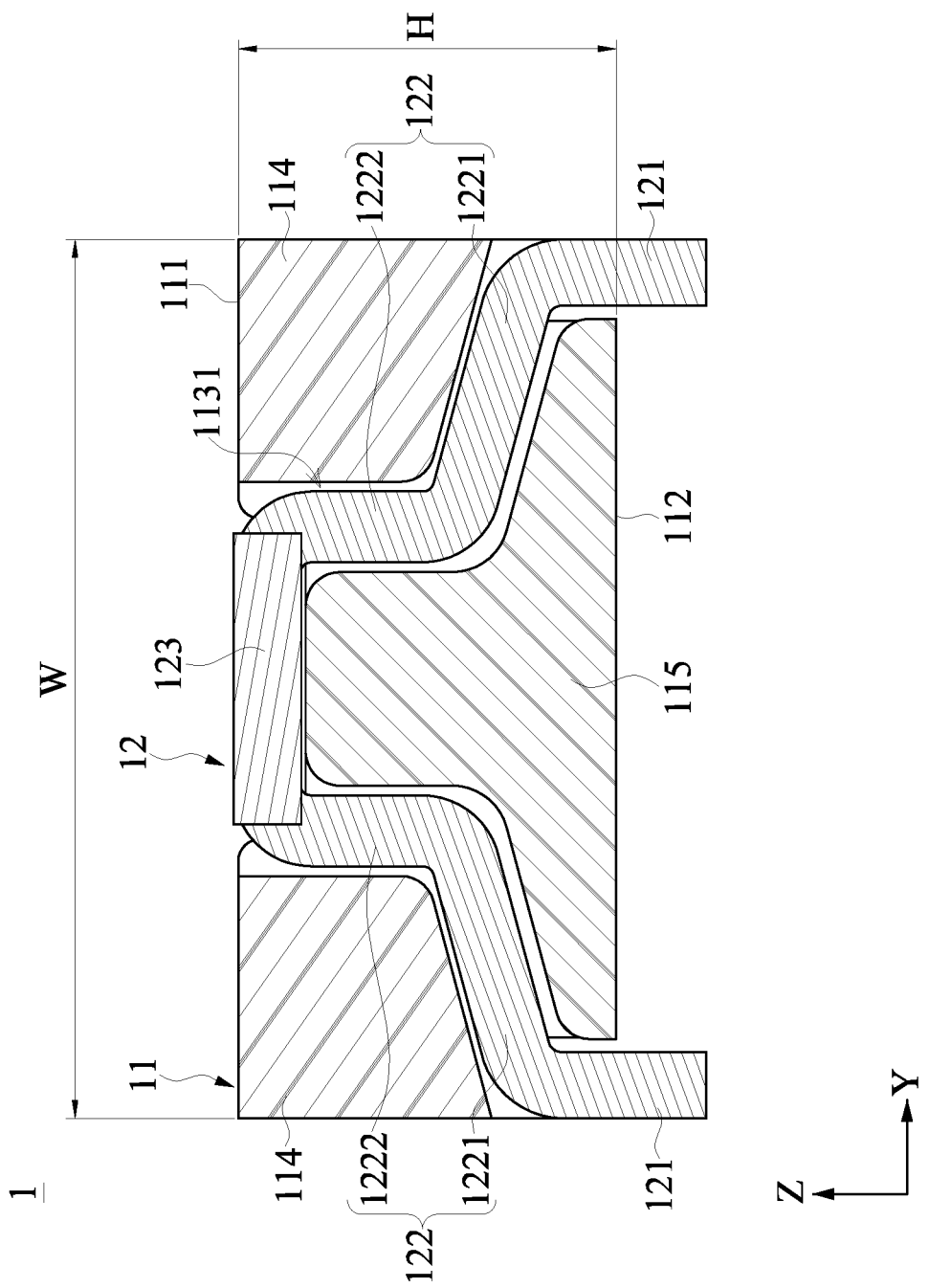
FIG. 5 is a schematic cross-sectional view of the inductor according to the first embodiment of the present disclosure.

As shown in FIG. 1 and FIG. 5, in an embodiment where a width W of the inductor 1 is greater than twice a height H of the inductor 1, and in a cross sectional view of the inductor 1 as shown in FIG. 5, the insulating body 11 is divided by the conductive body 12 into two first parts 114 and a second part 115. If a sum of cross-sectional areas of the two first parts 114 is equal to a cross-sectional area of the second part 115, a relevant personnel can simply modify the appearance of the conductive body 12 and the insulating body 11 to enable the relevant properties of the inductor 1 (i.e., withstand voltage, inductance) to easily meet requirements for general usage (i.e., withstand voltage between 20% to 30%).

Figure 6:
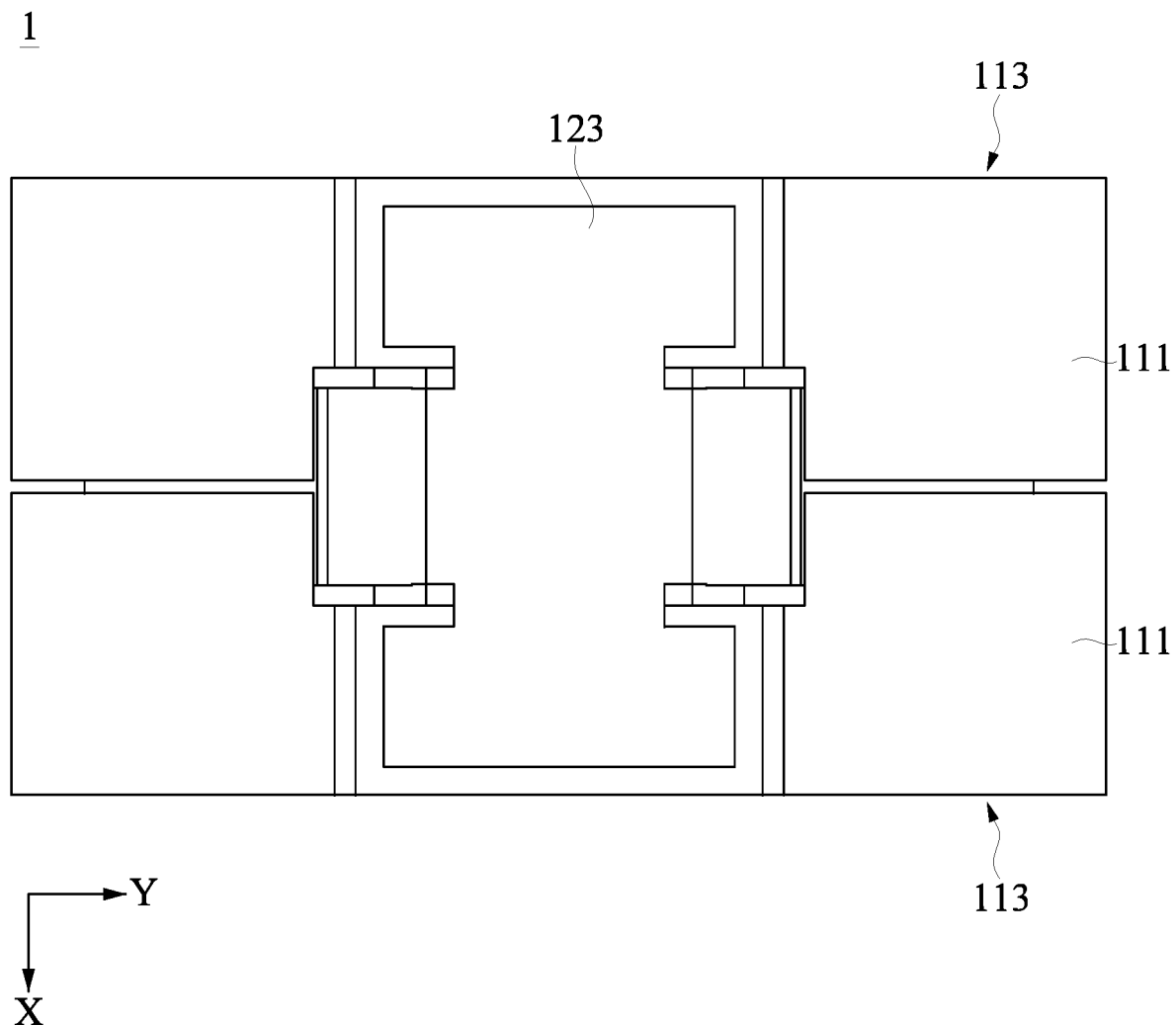
FIG. 6 is a schematic top view of the inductor according to the first embodiment of the present disclosure.

As shown in FIG. 6, in a top view of the inductor 1, an area of the heat dissipation part 123 is not less than 30% of an area of the top surface 111. In this way, the inductor 1 with the heat dissipation part 123 will have a significant difference in heat dissipation efficiency compared to the inductor 1 without the heat dissipation part 123.

Second Embodiment

Figure 7:
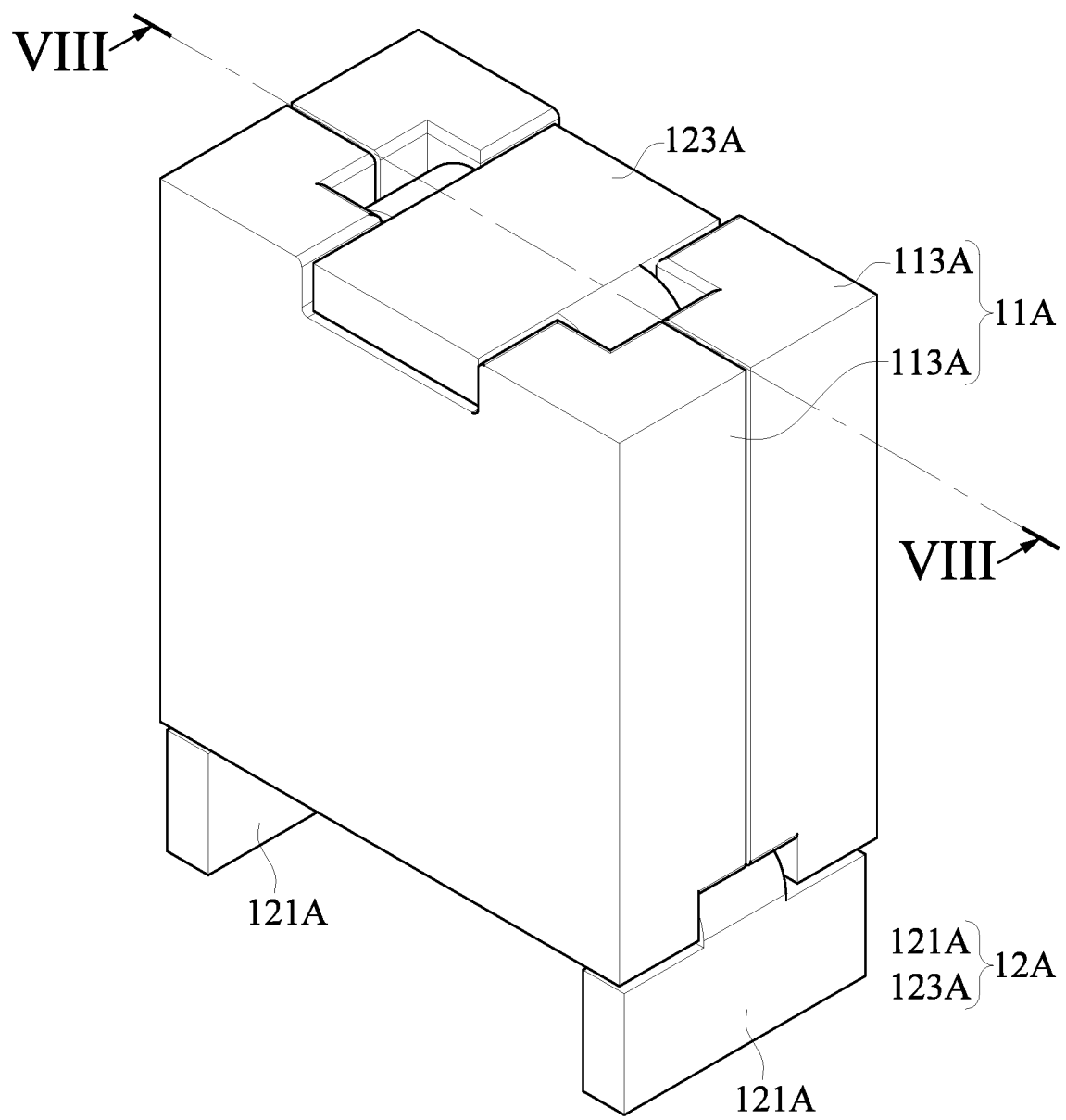
FIG. 7 is a schematic perspective view of an inductor according to a second embodiment of the present disclosure.
Figure 8:
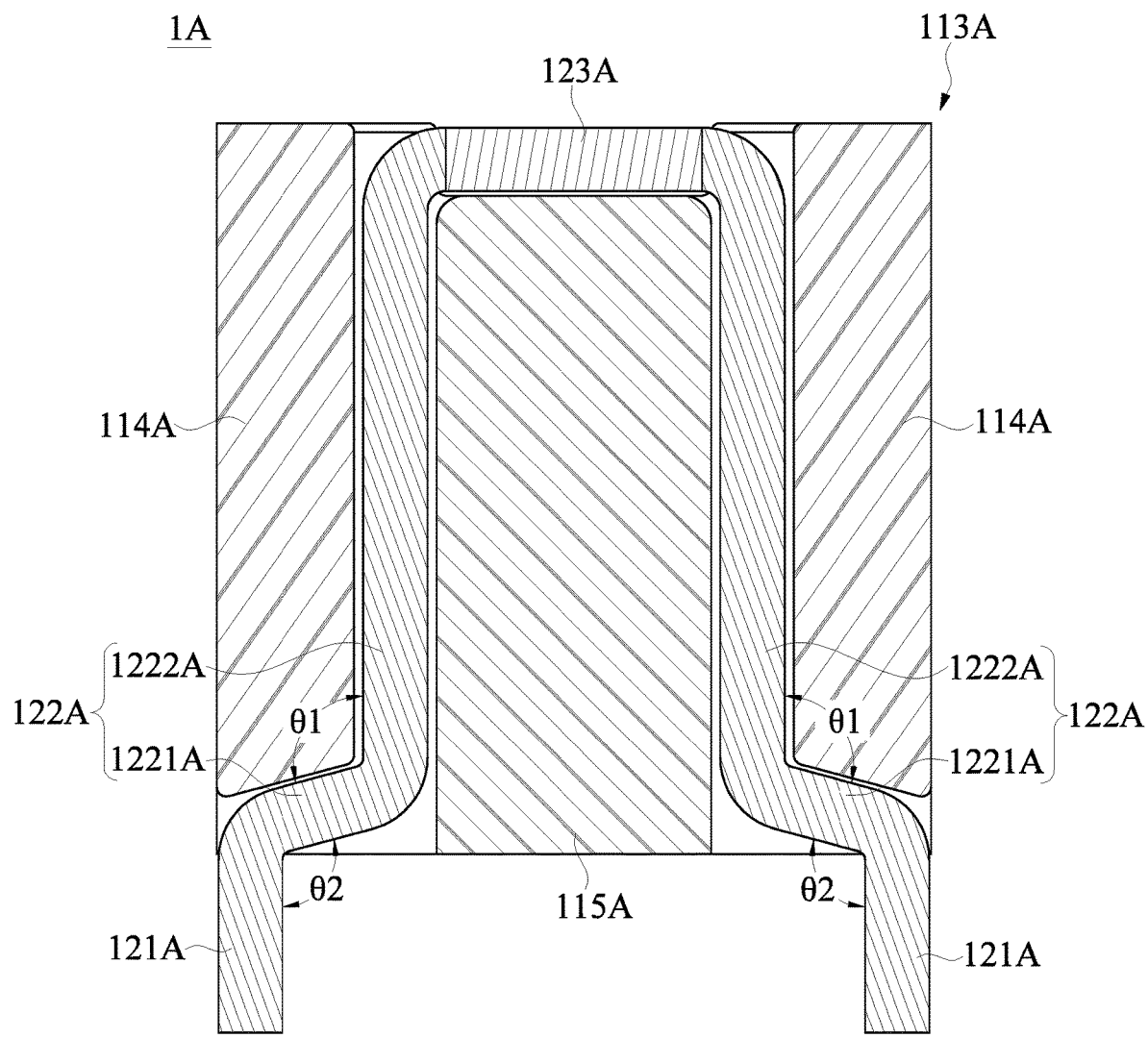
FIG. 8 is a schematic cross-sectional view of the inductor according to the second embodiment of the present disclosure.

FIG. 7 and FIG. 8 are respectively a schematic perspective view and a schematic cross-sectional view of an inductor according to a second embodiment of the present disclosure. The inductor 1A of the present embodiment includes an insulating body 11A and a conductive body 12A. The insulating body 11A may include two combination parts 113A. Details of the insulating body 11A can be referred to in the description of the aforementioned insulating body 11, which will not be repeated herein. The conductive body 12A includes two pin parts 121A, two connecting parts 122A, and a heat dissipation part 123A. Each of the connecting parts 122A includes an oblique section 1221A and a longitudinal section 1222A. Details of the two pin parts 121A, the two connecting parts 122A, the heat dissipation part 123A, the two oblique sections 1221A, and the two longitudinal sections 1222A can be referred to in the descriptions of the aforementioned pin parts 121, connecting parts 122, heat dissipation part 123, oblique sections 1221 and longitudinal sections 1222, and will not be repeated herein. The biggest difference between the inductor 1A of the present embodiment and the previous embodiment is that a length ratio of the oblique section 1221A and the longitudinal section 1222A of each of the connecting parts 122A are different.

As explained in the previous embodiment, the inductor 1A of the present embodiment can also be achieved by having an included angle $\theta1$ between each of the longitudinal sections 1222A and the corresponding oblique section 1221A connected thereto to be greater than 90 degrees and less than 150 degrees, and having an included angle $\theta2$ between each of the oblique sections 1221A and the corresponding pin part 121A connected thereto to be greater than 90 degrees and less than 150 degrees. Therefore, the conductor 12A is easily bent during a manufacturing process, and the relevant personnel can simply modify the appearances of the conductive body 12A and the insulating body 11A, so that the inductor 1A can easily meet the general requirements of use.

As shown in FIG. 8, which shows a schematic cross-sectional view of the inductor 1A of the present embodiment, the insulating body 11 is partitioned by the conductive body 12 into two first parts 114A and a second part 115A. Preferably, a sum of cross-sectional areas of the two first parts 114A is equal to a cross-sectional area of the second part 115A. In this way, the relevant personnel can simply modify the appearances of the conductive body 12 and the insulating body 11, so that the relevant characteristics (i.e., inductance, voltage resistance) of the inductor 1A can easily meet the general requirements of use.

Third Embodiment

Figure 9:
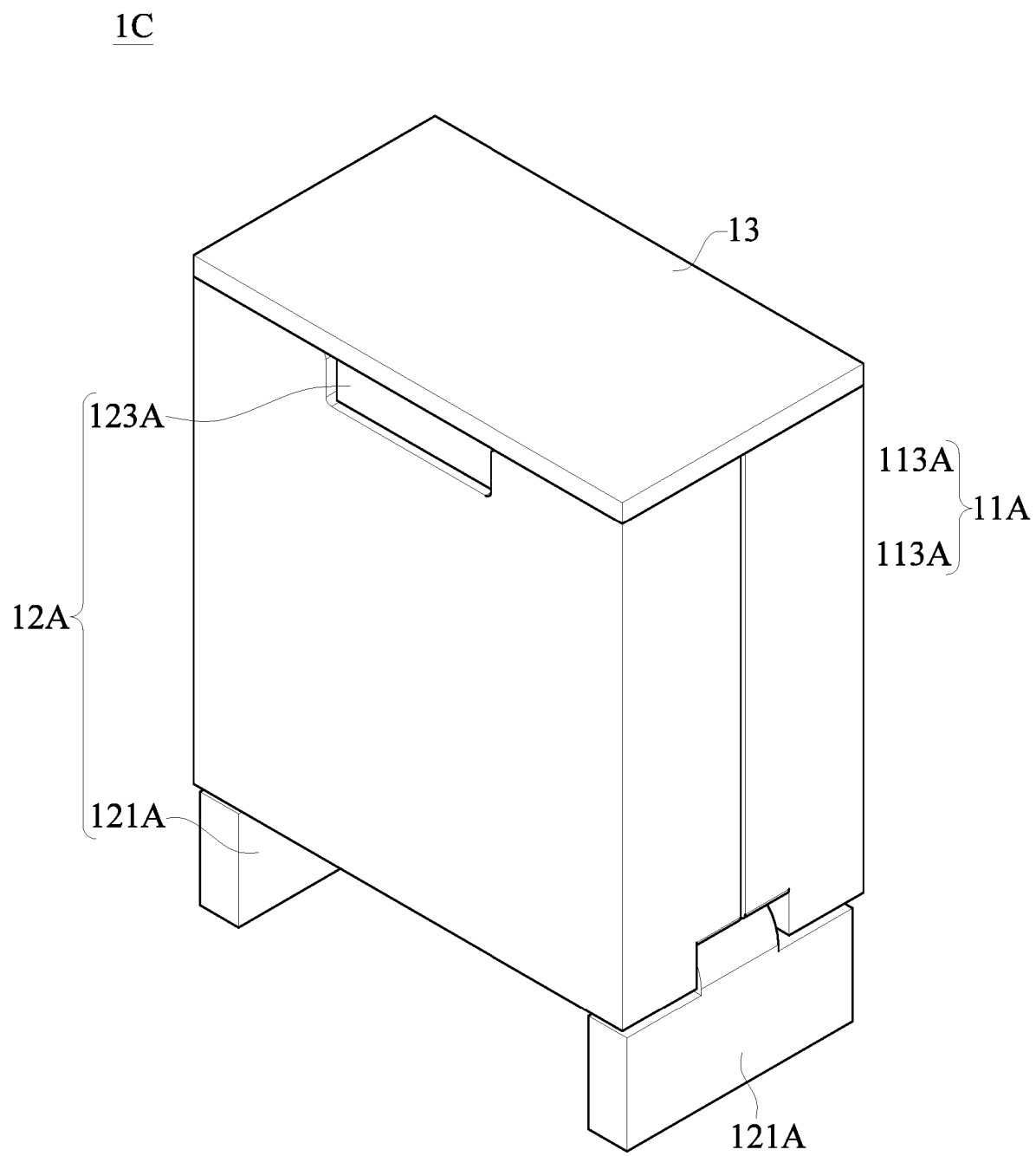
FIG. 9 is a schematic perspective view of an inductor according to a third embodiment of the present disclosure.
Figure 10:
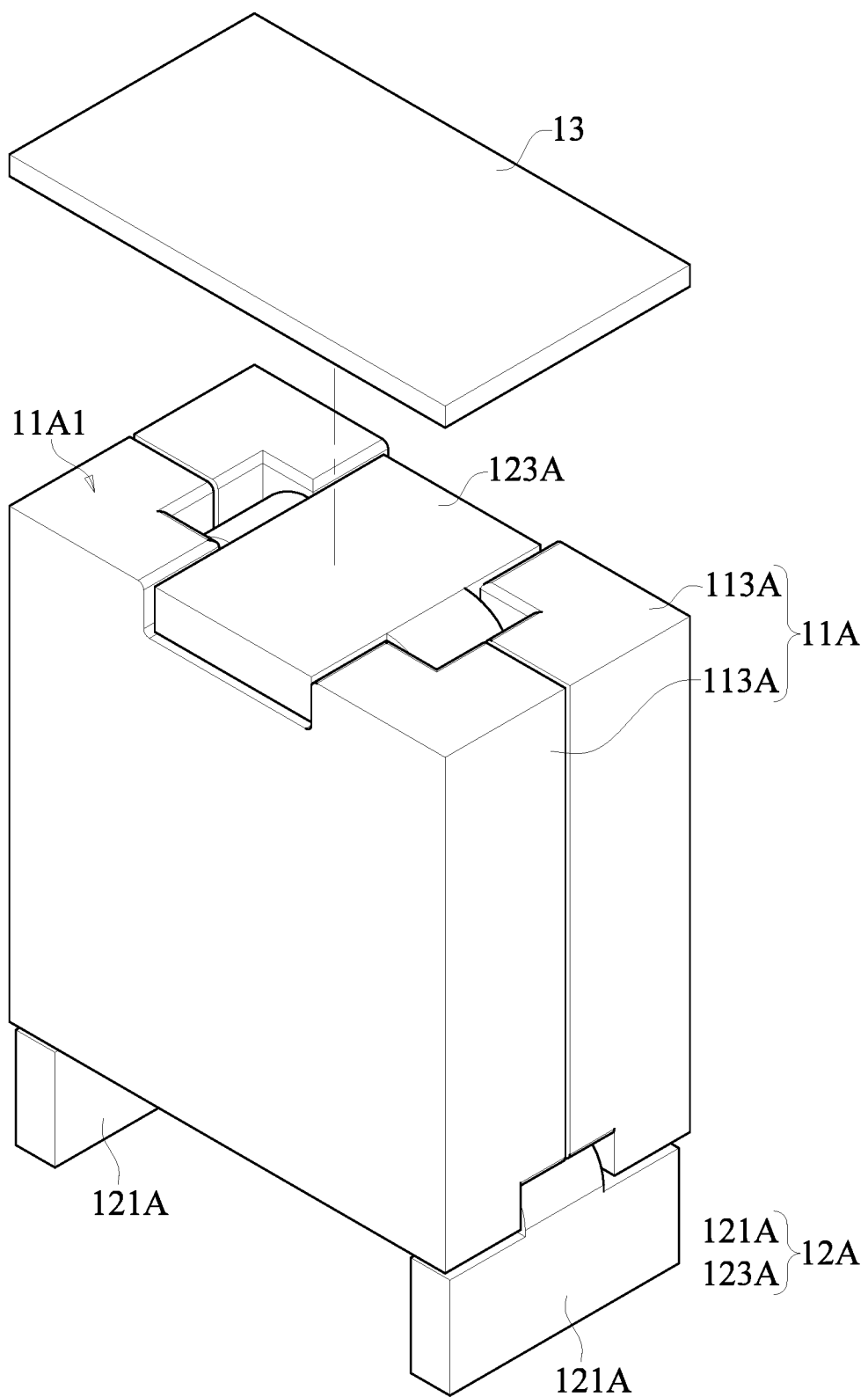
FIG. 10 is a schematic exploded view of the inductor according to the third embodiment of the present disclosure.

FIG. 9 and FIG. 10 are respectively a schematic perspective view and a schematic exploded view of an inductor according to a third embodiment of the present disclosure. The biggest difference between the inductor 1C of the present embodiment and the inductor 1B of the previous embodiment is that the inductor 1C further includes an auxiliary heat conducting plate 13. The auxiliary heat conducting plate 13 is connected to the heat dissipation part 123A. An area of the auxiliary heat conducting plate 13 is greater than an area of the heat dissipation part 123A. The auxiliary heat conducting plate 13 shields at least a part of the top surface 11A1 of the insulating body 11A.

In practical applications, the auxiliary heat conducting plate 13 can be made of any material with high thermal conductivity, such as various metal plates. The auxiliary heat conducting plate 13 and the heat dissipation part 123A may be, for example, fixed to each other by means of welding, bonding, or clamping. In addition, the auxiliary heat conducting plate 13 and the top surface 11A1 can also be fixed to each other by means of glue or the like according to practical requirements.

By virtue of the arrangement of the auxiliary heat conducting plate 13, the heat generated during an operation of the inductor 1C can be dissipated to an outside through the auxiliary heat conducting plate 13. In addition, the auxiliary heat conducting plate 13 preferably shields at least 80% of an area of the top surface 113A. Accordingly, a heat dissipation effect of the inductor 1C can be effectively improved.

Fourth Embodiment

Figure 11:
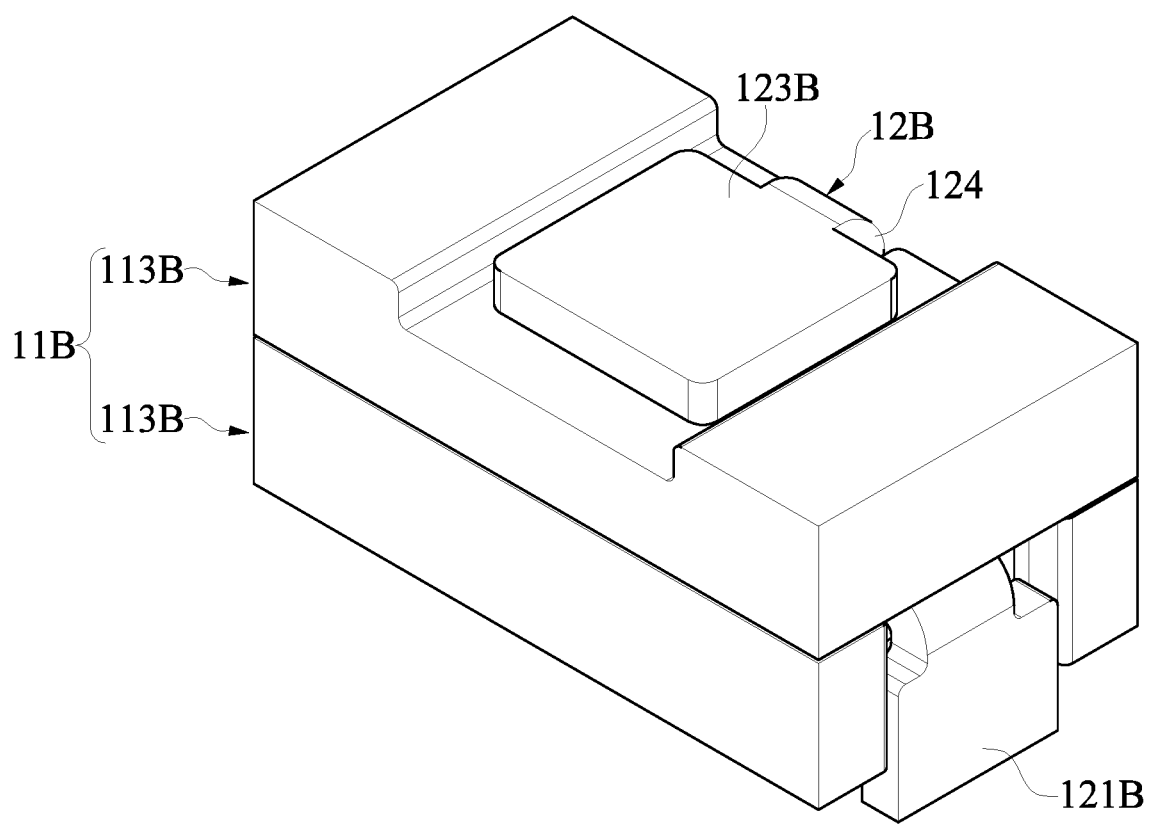
FIG. 11 and FIG. 12 are schematic perspective views of an inductor according to a fourth embodiment of the present disclosure from two different viewing angles.
Figure 12:
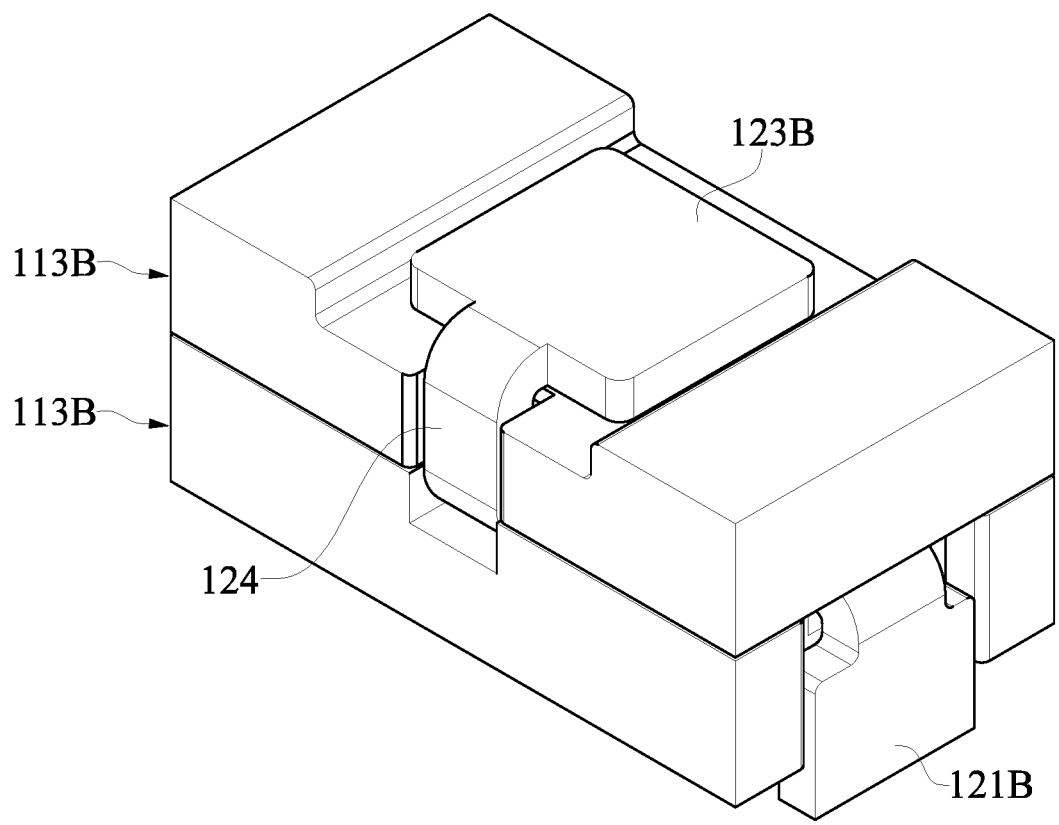
Figure 13:
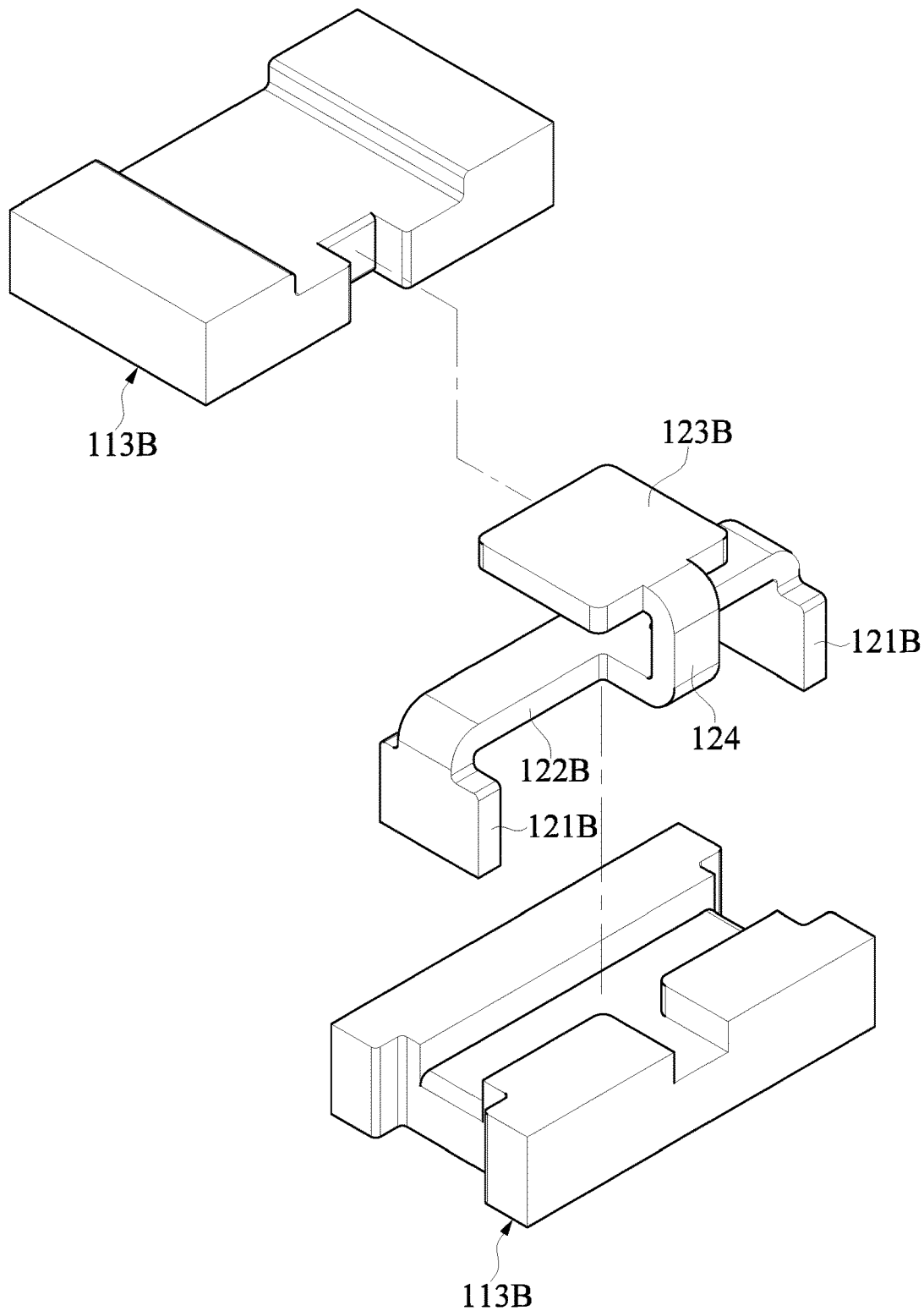
FIG. 13 is a schematic exploded view of the inductor according to the fourth embodiment of the present disclosure.

FIG. 11 and FIG. 12 are respectively two schematic perspective views of an inductor according to a fourth embodiment of the present disclosure from different perspectives, and FIG. 13 is a schematic exploded view of the inductor according to the fourth embodiment of the present disclosure. The inductor 1B of the present embodiment includes an insulating body 11B and a conductive body 12B. The insulating body 11B may include two combination parts 113B. Details of the insulating body 11B and the combination parts 113B are the same as the descriptions of the aforementioned insulating body 11 and the combination parts 113, and will not be repeated herein. The conductive body 12B includes two pin parts 121B, a heat dissipation part 123B, a connecting part 122B, and an auxiliary connecting part 124. The two pin parts 121B are used to be fixed to a circuit board. Two ends of the connecting part 122B are respectively connected to the two pin parts 121B. One side of the connecting part 122B extends outward and upward to form the auxiliary connecting part 124. An end of the auxiliary connecting part 124 away from the connecting part 122B is connected to a heat dissipation part 123B.

The conductive body 12B is fixedly arranged in the insulating body 11B. Each of the combination parts 113B of the insulating body 11B may have a plurality of grooves corresponding in shape to different parts of the conductor 12B. A portion of the auxiliary connecting part 124 and the heat dissipation part 123B are exposed outside the insulating body 11B. The auxiliary connecting part 124 and the heat dissipation part 123B can be used together to assist in transferring heat generated during an operation of the inductor 1B to an outside. The size and appearance of the connecting part 122B and the auxiliary connecting part 124 shown in the drawings of the present embodiment can be changed according to practical requirements, and the drawings shown are only an example.

Power Module

Figure 14:
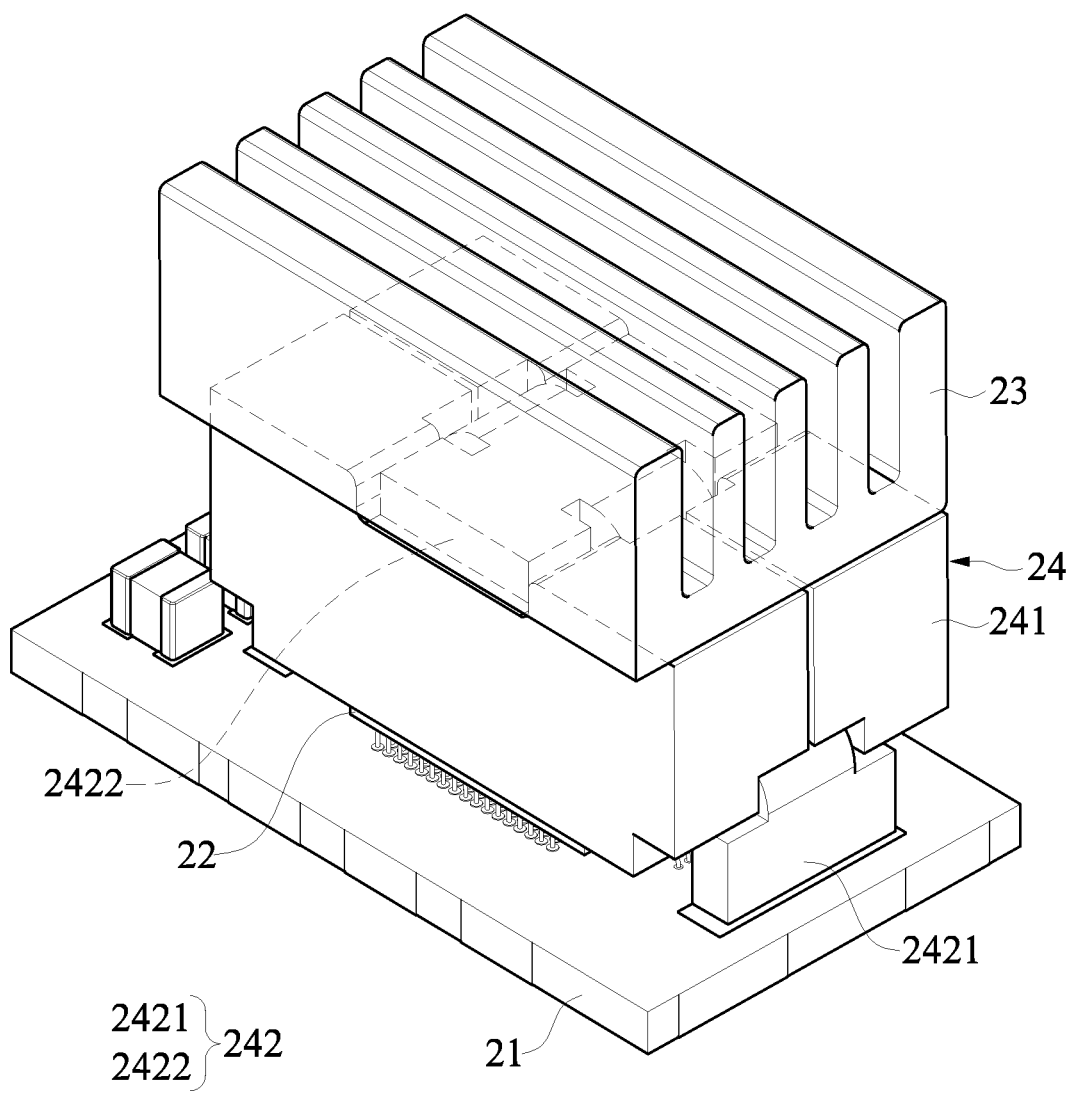
FIG. 14 is a schematic perspective view of a power module of the present disclosure.
Figure 15:
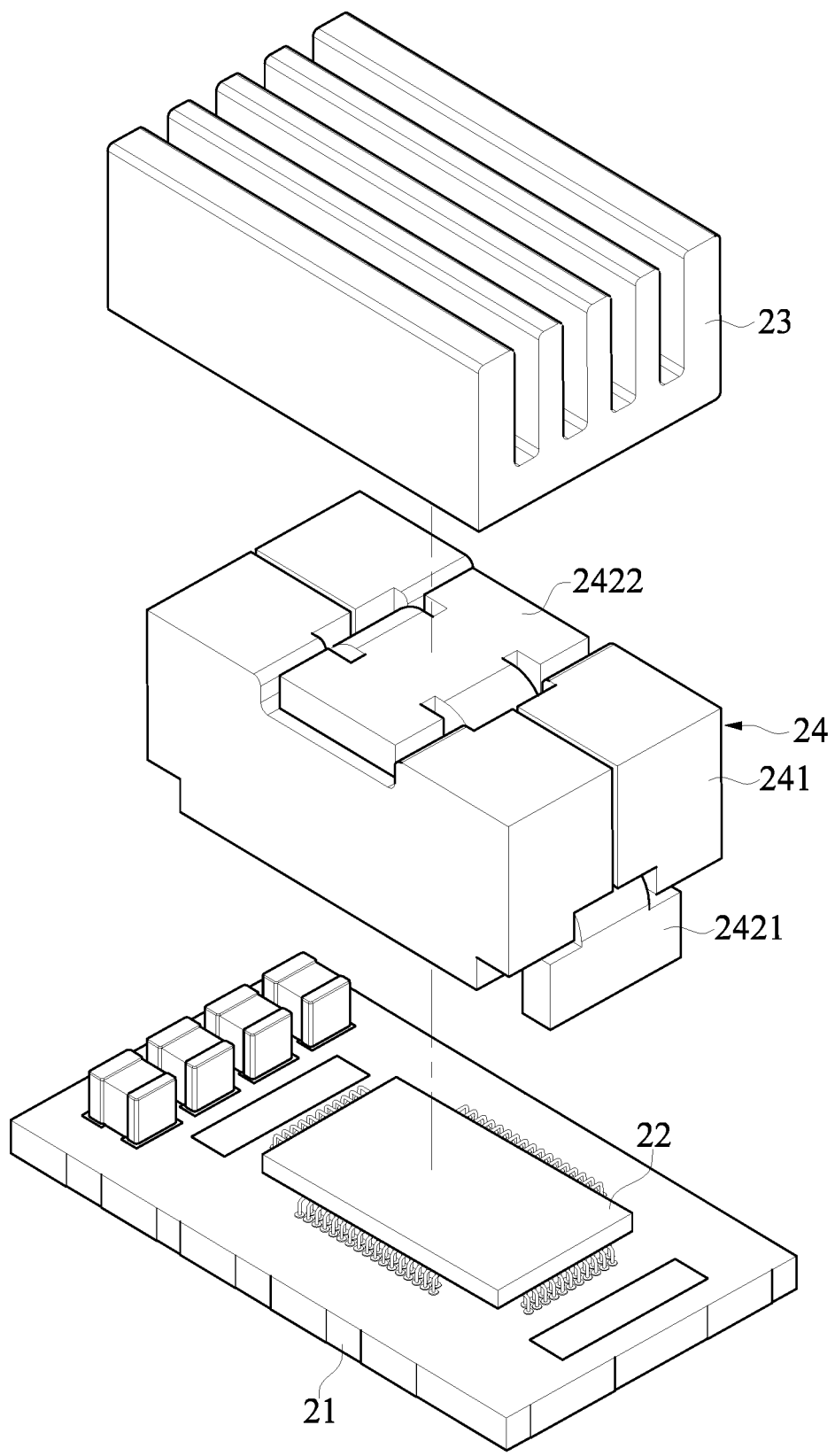
FIG. 15 is a schematic exploded view of the power module of the present disclosure.
Figure 16:
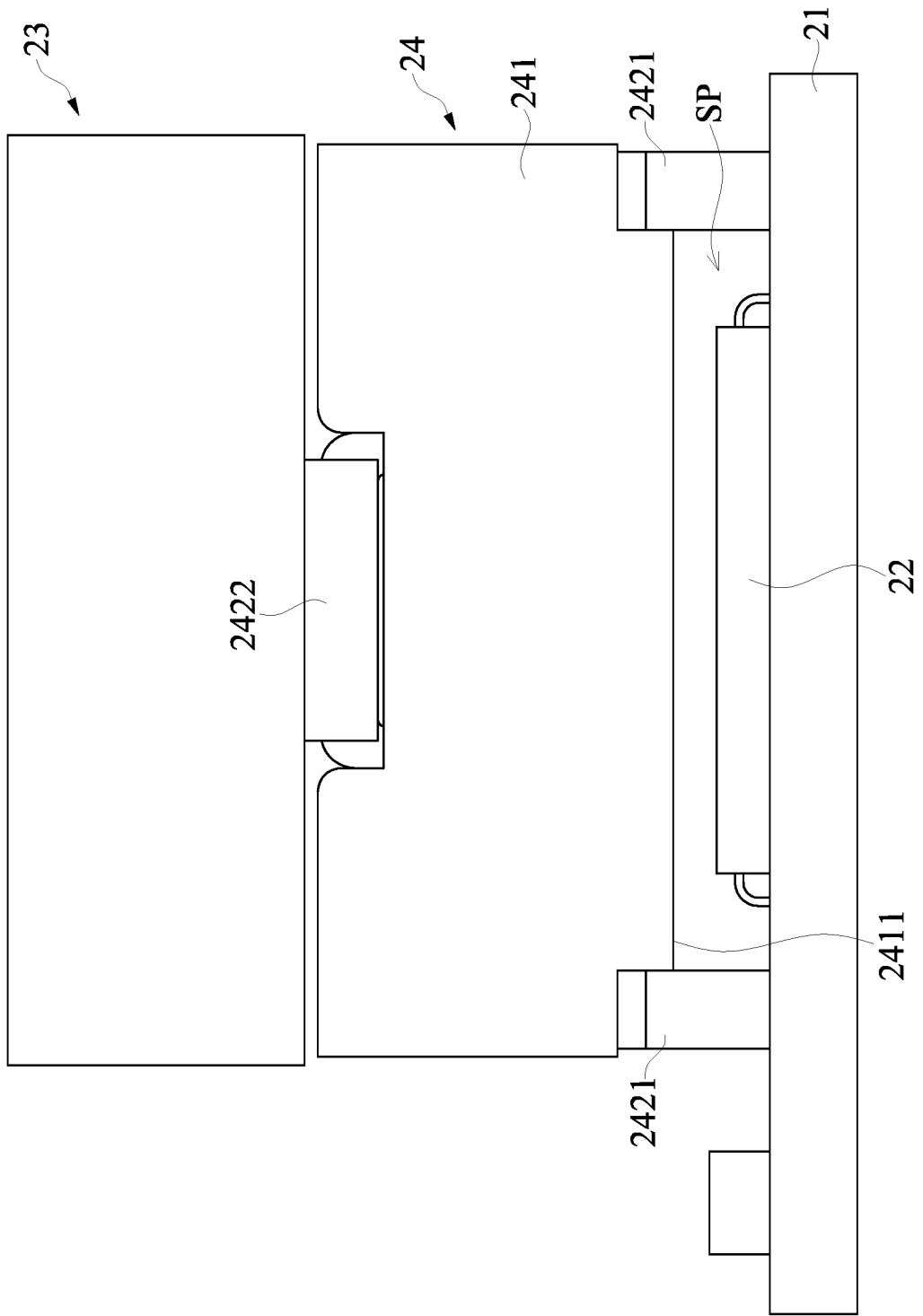
FIG. 16 is a schematic side view of the power module of the present disclosure.

FIG. 14 is a schematic perspective view of a power module of the present disclosure, FIG. 15 is a schematic exploded view of the power module of the present disclosure, and FIG. 16 is a schematic side view of the power module of the present disclosure. The power module 2 includes a circuit board 21, a chip 22, a heat dissipation member 23 and an inductor 24. The chip 22 is fixedly arranged on the circuit board 21. The inductor 24 includes an insulating body 241 and a conductive body 242. The conductive body 242 includes two pin parts 2421 and a heat dissipation part 2422. The inductor 24 and the components included therein of the present embodiment are the same as the aforementioned inductor 1 of the present disclosure, and will not be repeated herein.

When the inductor 24 is fixed on the circuit board 21 through the two pin parts 2421, the two pin parts 2421 and the bottom surface 2411 of the insulating body 241 will jointly form the accommodating space SP. The chip 22 is correspondingly located in the accommodating space SP. The heat dissipation member 23 is connected to the heat dissipation part 2422 of the inductor 1. In the drawings of the present embodiment, the heat dissipation member 23 has a plurality of fins, but the appearance of the heat dissipation member 23 is not limited thereto. The heat generated when the power module 2 is in operation can be transferred to the outside through the heat dissipation part 2422 and the heat dissipating member 23.

Figure 17:
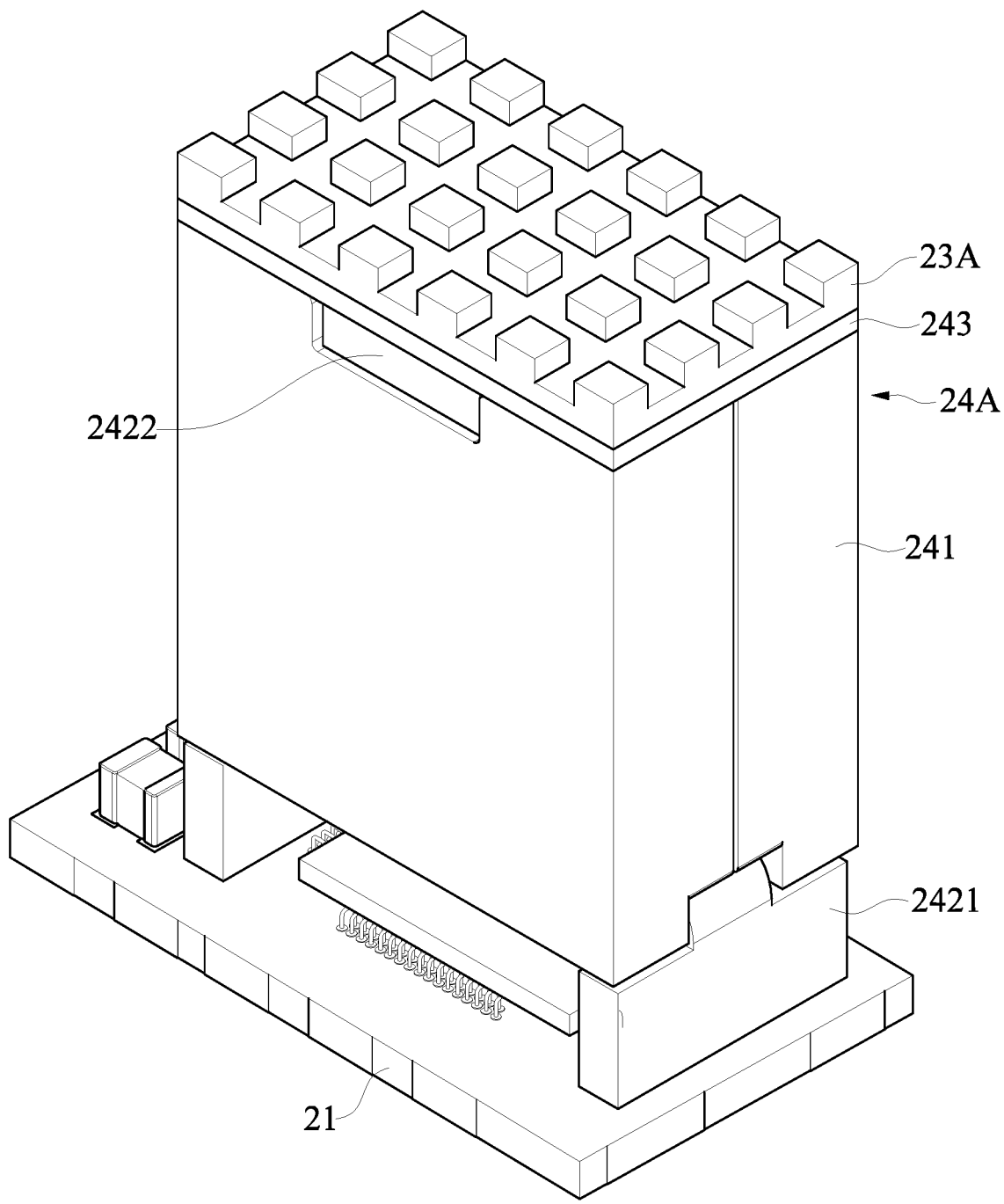
FIG. 17 and FIG. 18 are respectively a schematic perspective view and a schematic exploded view of a power module according to another embodiment of the present disclosure.
Figure 18:
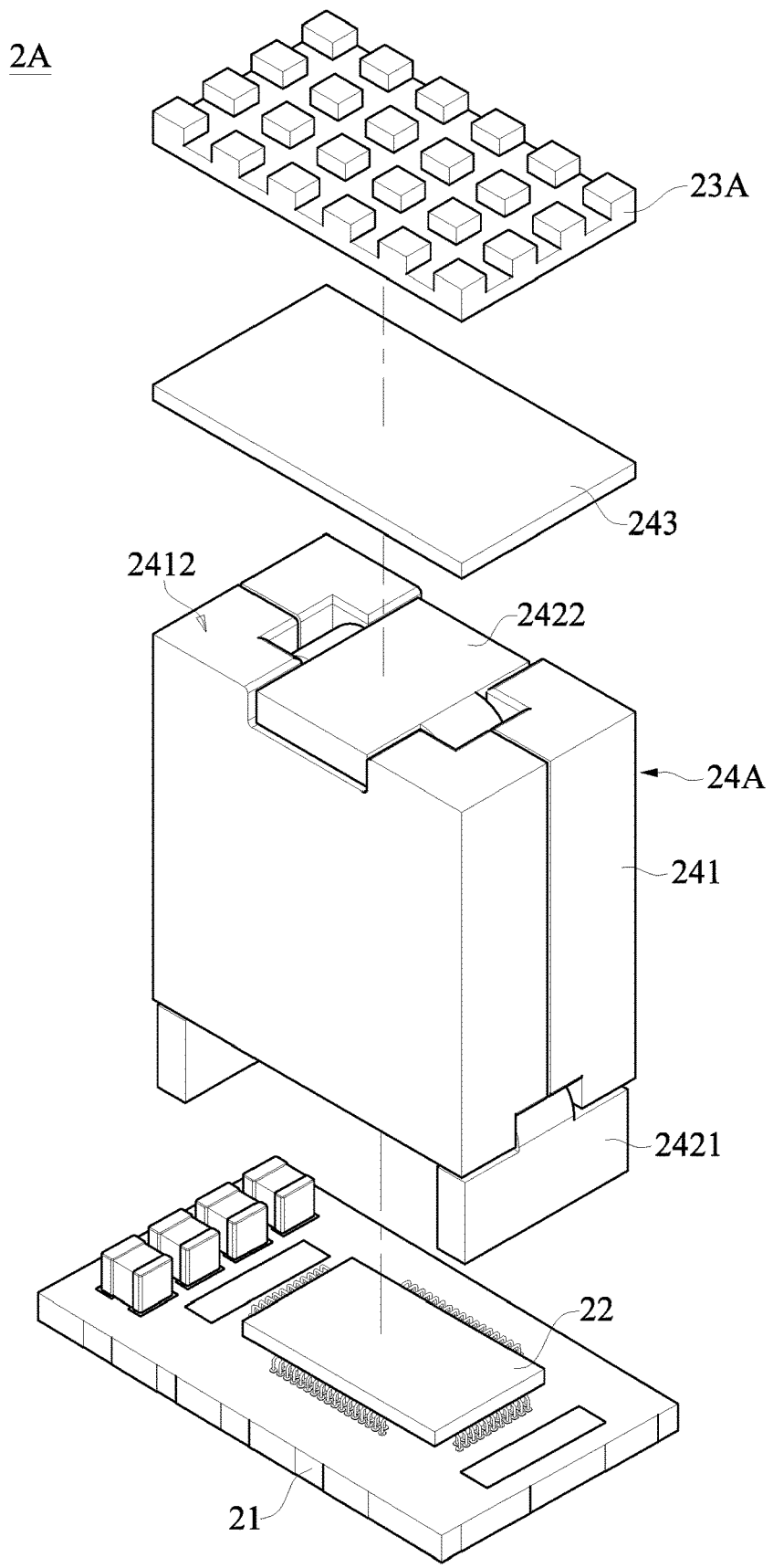

FIG. 17 and FIG. 18 are respectively a schematic perspective view and a schematic exploded view of a power module according to another embodiment of the present disclosure. The biggest difference between the present embodiment and the previous embodiment is that the inductor 24A of the power module 2A further includes an auxiliary heat conducting plate 243. The auxiliary heat conducting plate 243 is connected to the heat dissipation part 2422. An area of the auxiliary heat conducting plate 243 is greater than an area of the heat dissipation part 2422. The auxiliary heat conducting plate 243 shields at least a part of the top surface 2412 of the insulating body 241.

In practical applications, the auxiliary heat conducting plate 243 can be made of any material with high thermal conductivity, such as various metal plates. The auxiliary heat conducting plate 243 and the heat dissipation part 2422 may be fixed to each other by means of welding, bonding, or clamping, for example. In addition, the auxiliary heat conducting plate 243 and the top surface 2412 can also be fixed to each other by means of glue or the like according to requirements.

Another difference between the present embodiment and the previous embodiment is that the appearance of the heat dissipation member 23A of the power module 2A has a plurality of columnar structures. Of course, the appearance of the heat dissipation member 23A can be changed according to requirements, and the drawing shown is only one of the exemplary aspects.

By virtue of the arrangement of the auxiliary heat conducting plate 243, the heat generated during an operation of the inductor 24A can be dissipated to an outside through the auxiliary heat conducting plate 243. The auxiliary heat conducting plate 243 preferably shields at least 80% of an area of the top surface 2412. In this way, the heat dissipation effect of the inductor 24 can be effectively improved.

By enabling the conductive body 242 of the inductor 1 to have a heat dissipation part 2422 and by connecting the heat dissipation part 2422 to the heat dissipation member 23, the heat generated during an operation of the power module 2 of the present disclosure can be transferred to an outside relatively quickly, so that a temperature of the power module 2 will not rise continuously, and a service life of the power module 2 can be increased.

Beneficial Effect of the Embodiments

In conclusion, the inductor and the power module of the present disclosure can effectively discharge the heat generated by the inductor and the power module during operation through the design of the heat dissipation part of the conductive body.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:
1. An inductor, comprising:
an insulating body having a top surface and a bottom surface; and
a conductive body including:
two pin parts, a portion of each of the two pin parts being exposed outside the bottom surface, and the two por- tions of the two pin parts exposed outside the insulating body being respectively configured to fix to a circuit board; and
a heat dissipation part being connected to the two pin parts, the heat dissipation part being exposed outside the top surface, and the heat dissipation part being configured to connect to an external heat dissipation member;
wherein, when the inductor is fixed to the circuit board through the two pin parts exposed outside the bottom surface, the two pin parts and the bottom surface jointly define an accommodating space;
wherein, when the heat dissipation part is connected to the external heat dissipation member, heat energy generated by an operation of the inductor is capable of being transferred to outside through the heat dissipation part and the external heat dissipation member;
wherein the conductive body further includes two oblique sections and two longitudinal sections, two ends of each of the oblique sections are respectively connected to one of the two pin parts and one of the two longitudinal sections, two sides of the heat dissipation part are respectively connected to the two longitudinal sections;
wherein, in a side view of the conductive body, an included angle between each of the longitudinal sections and the corresponding oblique section connected thereto is greater than 90 degrees and less than 150 degrees;
wherein, in the side view of the conductive body, an included angle between each of the oblique sections and the corresponding pin part connected thereto is greater than 90 degrees and less than 150 degrees.

2. The inductor according to claim 1, wherein a width of the inductor is at least greater than twice a height of the inductor.

3. The inductor according to claim 1, wherein, in a top view of the inductor, an area of the heat dissipation part is not less than 30% of an area of the top surface.

4. The inductor according to claim 1, wherein, in a cross-sectional view of the inductor, the conductive body divides the insulating body into a first part and two second parts, and a sum of cross-sectional areas of the two second parts is equal to a cross-sectional area of the first part.

5. The inductor according to claim 1, wherein the conductive body further includes a connecting part and an auxiliary connecting part, two ends of the connecting part are respectively connected to the two pin parts, one end of the auxiliary connecting part is connected to one side of the connecting part, and another end of the auxiliary connecting portion is connected to the heat dissipation part.

6. The inductor according to claim 1, further comprising: an auxiliary heat conducting plate, the auxiliary heat conducting plate is connected to the heat dissipation part, an area of the auxiliary heat conducting plate is greater than an area of the heat dissipation part, and the auxiliary heat conducting plate shields at least a part of the top surface.

7. The inductor according to claim 6, wherein the auxiliary heat conducting plate shields at least 80% of an area of the top surface.

8. A power module, comprising:
a circuit board;
a chip being fixedly disposed on the circuit board;
an external heat dissipation member;
at least one inductor, including:
an insulating body having a top surface and a bottom surface; and
a conductive body including:
two pin parts, a portion of each of the two pin parts being exposed outside the bottom surface, and the two portions of the two pin parts exposed outside the insulating body being respectively fixed to the circuit board; and
a heat dissipation part being connected to the two pin parts, the heat dissipation part being exposed outside the top surface, and the heat dissipation part being connected to the external heat dissipation member;
wherein the inductor is fixed to the circuit board through the two pin parts exposed outside the bottom surface, the two pin parts and the bottom surface jointly define an accommodating space, and the chip is located in the accommodating space;
wherein, when the heat dissipation part is connected to the external heat dissipation member, heat energy generated by an operation of the inductor is capable of being transferred to outside through the heat dissipation part and the external heat dissipation member;
wherein the conductive body further includes two oblique sections and two longitudinal sections, two ends of each of the oblique sections are respectively connected to one of the two pin parts and one of the two longitudinal sections, two sides of the heat dissipation part are respectively connected to the two longitudinal sections;
wherein, in a side view of the conductive body, an included angle between each of the longitudinal sections and the corresponding oblique section connected thereto is greater than 90 degrees and less than 150 degrees;
wherein, in the side view of the conductive body, an included angle between each of the oblique sections and the corresponding pin part connected thereto is greater than 90 degrees and less than 150 degrees.

9. The power module according to claim 8, wherein the inductor further includes: an auxiliary heat conducting plate, the auxiliary heat conducting plate is connected to the heat dissipation part, an area of the auxiliary heat conducting plate is greater than an area of the heat dissipation part, and the auxiliary heat conducting plate shields at least a part of the top surface.

10. The power module according to claim 9, further comprising a heat dissipation member, the heat dissipation member being fixedly disposed on a side of the auxiliary heat conducting plate away from the side connected to the heat dissipation part.

11. The power module according to claim 9, wherein the auxiliary heat conducting plate shields at least 80% of an area of the top surface.

* * * * *